United States Patent
Schoen

(10) Patent No.: US 8,186,224 B2
(45) Date of Patent: *May 29, 2012

(54) SENSOR AND METHOD FOR ITS MANUFACTURE

(75) Inventor: Dierk Schoen, Egelsback (DE)

(73) Assignee: Pepperl + Fuchs GmbH, Mannheim (DE)

( * ) Notice: Subject to any disclaimer, the term of this patent is extended or adjusted under 35 U.S.C. 154(b) by 548 days.

This patent is subject to a terminal disclaimer.

(21) Appl. No.: 12/361,570

(22) Filed: Jan. 29, 2009

(65) Prior Publication Data
US 2009/0188321 A1 Jul. 30, 2009

(30) Foreign Application Priority Data

Jan. 30, 2008 (DE) .......................... 10 2008 006 746
Feb. 13, 2008 (EP) ..................................... 08002680

(51) Int. Cl.
*G01N 29/00* (2006.01)
*G01F 9/33* (2006.01)
(52) U.S. Cl. .................. 73/632; 73/649; 340/815.45
(58) Field of Classification Search .............. 73/632, 73/649; 340/815.45; 29/595; 362/231
See application file for complete search history.

(56) References Cited

U.S. PATENT DOCUMENTS

| 3,305,818 | A | * | 2/1967 | Brueggeman et al. ............. 338/4 |
| 4,389,902 | A | * | 6/1983 | Kataoka et al. ............. 73/861.77 |
| 5,129,262 | A | * | 7/1992 | White et al. .................... 73/599 |
| 5,189,914 | A | * | 3/1993 | White et al. .................... 73/599 |
| 5,244,409 | A | * | 9/1993 | Guss et al. .................... 439/490 |
| 7,794,107 | B2 | * | 9/2010 | Schoen et al. ................ 362/231 |
| 2005/0232638 | A1 | * | 10/2005 | Fucile et al. .................. 398/140 |
| 2011/0001550 | A1 | * | 1/2011 | Schoen ......................... 327/517 |

FOREIGN PATENT DOCUMENTS

DE 103 43 529 A1 4/2005

* cited by examiner

*Primary Examiner* — J M Saint Surin
(74) *Attorney, Agent, or Firm* — John A. Merecki; Hoffman Warnick LLC

(57) ABSTRACT

The invention relates to a sensor with a transducer unit, which is located at a measurement end in a housing sleeve, with connection means at a connection end of the housing sleeve opposite to the measurement end, with a module carrier received in the housing sleeve and on which is placed a sensor electronics and which extends along an axis of the housing sleeve, with illuminants for the optical signaling to the outside of operating and/or switching states of the sensor. The sensor is characterized in that there is a separate, plate-like illuminant carrier, that a plurality of illuminants are placed on the illuminant carrier and that the illuminant carrier is positioned transversely to the module carrier in the vicinity of the transducer unit. The invention also relates to a method for the manufacture of a sensor.

17 Claims, 5 Drawing Sheets

SENSOR AND METHOD FOR ITS MANUFACTURE

FIELD OF THE INVENTION

The present invention relates to a sensor and a method for the manufacture of a sensor.

RELATED ART

One type of sensor is e.g. described in DE 103 43 529 A1 and has the following components: a transducer unit placed in a housing sleeve at a measurement end, connection means at a connection end of the housing sleeve opposite to the measurement end, a module carrier received in the housing sleeve and on which is placed sensor electronics and which extends along an axis of the housing sleeve and lighting means or illuminants for the optical signaling to the outside of operating and/or switching states of the sensor.

Such sensors are e.g. used in automation technology for numerous tasks.

In order to provide operating personnel information concerning a sensor operating or switching state, in the case of the known sensors the desired information is optically signaled to the outside. Here, a basic problem is to so guide to the outside the light of the illuminants used that a very good all-round visibility is achieved. The optical signals and optical information must therefore be visible in an optimum manner largely independently of the location of the observer.

Limitations exist to the extent that on the one hand a diameter of an e.g. cylindrical sensor must be chosen as small as possible, but on the other a very large and very well illuminated surface, e.g. at a front end of the sensor must be made available.

In the hitherto known solutions the illuminants are placed on the same module carrier as the sensor electronics, so that at least parts of a lighting surface are not well illuminated.

SUMMARY OF THE INVENTION

The present invention provides a sensor, in which the available light of the lighting means can be used particularly effectively for signaling operating and/or switching states. In addition, a method for the manufacture of such a sensor is provided.

Preferred developments of the inventive sensor and advantageous variants of the inventive method form the subject matter of the dependent claims and are also explained in the following description, particularly in conjunction with the drawings.

The sensor of the aforementioned type is inventively further developed in that there is a separate plate-like illuminant carrier, that a plurality of illuminants are placed on the illuminant carrier, and that the illuminant carrier is positioned transversely to the module carrier in the vicinity of the transducer unit.

In the inventive method, the following method steps are performed: A shielding can is connected to a transducer receptacle, a transducer element is inserted in the shielding can, said shielding can, the transducer receptacle, and the transducer element forming a transducer unit, a plate-like illuminant carrier on which is placed a plurality of illuminants being connected to the transducer unit, a module carrier with sensor electronics is connected at a measurement end to the transducer unit, the illuminant carrier being transversely positioned relative to the module carrier in the assembled state and the module carrier together with the transducer unit is inserted into a housing sleeve and in the assembled state an axis of the housing sleeve runs transversely to the illuminant carrier.

In accordance with the present invention, the arrangement of the sensor electronics is decoupled from the positioning of the illuminants, so that there is more freedom with respect to illuminant positioning.

According to an embodiment of the invention, the illuminants are positioned on a separate illuminant carrier and this is located transversely to a housing axis. Thus, the illuminants can be positioned e.g. directly behind a front face of the sensor, i.e. directly behind a signal lighting surface to be illuminated.

Thus, using simple means, the invention makes it possible to achieve a much improved illumination of a signal lighting surface.

The sensors can fundamentally be any type of sensor for the detection of a measured quantity or for the detection of articles or objects. With particular advantage the present invention can be used for sensors in the industrial sector, e.g. inductive or capacitive sensors, pressure or temperature sensors or also optical sensors.

The transducer element can fundamentally be any element suitable for the detection of a physical quantity. The transducer element can e.g. be a piezoelectric element of an ultrasonic sensor, a coil or a resonant circuit of an inductive proximity switch, a capacitive probe, a thermocouple or also a photodetector of an optical sensor.

The housing sleeve axis can e.g. be the cylinder axis of a cylindrical housing sleeve. The module carrier, which can in particular be a conventional printed circuit board, then extends within the housing sleeve in such a way that the module carrier surface is essentially parallel to the housing sleeve axis. The axis need not necessarily run through the module carrier and instead the latter can be arranged e.g. slightly displaced relative to a cylinder axis.

To a connection end of the housing sleeve are fitted connection means, which can e.g. be a plug outlet or also a cable outlet.

In an embodiment of the inventive sensor the transducer receptacle is at least partly made from a transparent plastic. The light of the illuminants can then be passed to the outside through the transducer receptacle. The lighting means are placed in the vicinity of the transducer receptacle, so that the latter in much the same way as a light waveguide can bring the light to a front part or at least an exposed part of the sensor. This has hitherto been scarcely possible in the prior art for space reasons and consequently various other advantages are obtained.

The invention e.g. permits an up to 50% shorter design of ultrasonic transducers, so that overall much smaller sensors can be made.

The transducer receptacle may be manufactured by moulding around the shielding can. This leads to improved properties in the high voltage test and also, due to the shorter design, simplifications on feeding in a current. Finally, improved EMC characteristics can be obtained.

The inventive method may comprise a modular, standardized manufacturing method and in particular manufacturing costs can be saved in the final installation of the sensors. In particular, the transducer receptacle or transducer unit can have a modular form.

The in particular plate-like module carrier with the sensor electronics and illuminant carrier with the illuminants can be referred to as an electronic module, which can in particular be plugged or slid into the transducer receptacle from the rear, i.e. from a side remote from the measurement side. This leads to advantages in connection with the final installation and also an installation of the transducer can be optimized.

With cylindrical sensors the transducer receptacle may project through to a front face of the sensor. The active sensor surface of a proximity switch or presence sensor can e.g. be surrounded by one or more illuminants for switching or operating state display purposes. Alternatively or additionally the illuminant or the illuminating surfaces can be placed in a central area, especially in the centre of a sensor surface.

Thereby, the light of the illuminants can be utilized more effectively if light coupling in elements are shaped onto the transducer receptacle for each illuminant. Said light coupling in elements are preferably shaped in such a way that maximum light from the illuminants is coupled into the at least partly transparent transducer receptacle. The transducer receptacle is also appropriately formed in such a way that the light is passed in as loss-free a manner as possible to a lighting surface, where it is once again effectively coupled out. A number of measures can be taken for this purpose. The transducer receptacles, which are in particular injection mouldings, can e.g. in targeted manner be so manufactured that at desired points there is a formation of internal cavities also known as voids.

The internal reflections on said cavities can favourable influence the light conducting behaviour of the transducer receptacle. If a coupling out of light is to be completely prevented at certain points of the transducer receptacle, metallizations or other suitable coatings can also be applied there.

The illuminants can fundamentally be constituted by any known components, but for space reasons preference is given to light emitting diodes, particularly SMD light emitting diodes.

A simple and mechanically stable construction is obtained if the illuminant carrier is positively received in the transducer receptacle. Appropriately the illuminant carrier is so dimensioned that in the installed state it is supported on an inner wall of the transducer receptacle or the housing sleeve, so that the construction is then particularly stable.

The signal lighting surface to be illuminated can e.g. be a circular ring on a front face of the sensor. The lighting means or illuminants are then appropriately placed in an outer marginal area of the illuminant or lighting means carrier. The illumination is particularly homogeneous if the illuminants are uniformly distributed over the circumference.

In principle, the number of illuminants to be housed on an illuminant carrier is only limited by the space available. In the case of cylindrical sensors with a diameter of approximately 20 mm, very good results are e.g. obtained for a circular ring-like signal lighting surface with four light emitting diodes arranged with an angular spacing of in each case 900 on the illuminant carrier.

The mechanical construction and assembly can be made simpler if the illuminant carrier has recesses, particularly milled slots, for the insertion of the module carrier. In a method step the module carrier can be assembled with the illuminant carrier and as a result an electronics module is formed.

Another fundamental difficulty with sensors of the present type is that e.g. in the case of a ceiling installation of spacing-measuring sensors with a large range, such as ultrasonic proximity switches or optical proximity switches, due to the installation position of the sensor and the positioning of the sensor displays on a transducer end opposite to the measurement end, it has hitherto not been possible to see the switching displays at a measurement end. However, an optical signaling of operating states, switching states and programming or acknowledgement displays is advantageous for putting into operation an installed sensor and monitoring the correct functionality of such a sensor during continuous operation.

It is often also necessary to install a sensor in a facing of an industrial plant. If in the case of the sensors optical signaling only takes place at the measurement end or the connection end, the aforementioned operating and/or switching state displays can only be examined from one side, which is often that which is remote from the transducer element.

Moreover, the installation position of proximity switches, quite independently of the respective sensor principle used, is generally not predeterminable in the industry. However, for putting into operation plants with proximity switches it is advantageous and often necessary to be able to examine the display elements, i.e. the optical signaling of the sensor. Thus, independently of a sensor installation position, it is advantageous to have always a display of the aforementioned states at least one end of a proximity switch.

In a variant of the inventive sensor further illuminants are consequently provided at the connection end for the optical signaling to the outside of sensor operating and/or switching states. Advantageously the illuminants are placed on a further illuminant carrier at the connection end and which is also transversely positioned relative to the module carrier. It is possible to provide illuminants on the module carrier both at the measurement end and at the connection end.

Thus, for the connection-side illuminants it is possible to achieve the same positive characteristics with regards to all-round visibility as for the measurement end.

Particularly for panel or ceiling installation, an all-round visibility from both the front and rear is obtained, with the exclusion of the regions round the retaining means. This complete all-round visibility is in particular obtained for cylindrical proximity switches.

In the variant where both at the measurement end and at the connection end illuminants are provided, a much more practical use is achieved. Switching states, operating states and functional displays of sensors can then also be read off if they are installed at inaccessible locations, e.g. on the ceiling of large factory buildings. Moreover, the corresponding displays can also be read off and identified in the case of sensors installed in a machine facing, e.g. in a metal wall.

Customers also find attractive all-round lighting, particularly of circular operating and control elements, e.g. in the consumer goods industry, which is the case with proximity switches. Apart from practical use, the inventive technical measures also allow an attractive design.

It has hitherto been difficult in the prior art to continuously, i.e. homogeneously illuminate the generally very thin border of the transducer element or transducer receptacles, because the illuminants have to be very small and space-saving, but at the same time provide strong illumination whilst being inexpensive. To this extent, use is made of SMD light emitting diodes. With the aid of the present invention the homogeneous illumination of the respective signal lighting surface is significantly improved.

In another advantageous variant the transducer receptacle is closed at a measurement end. This is particularly appropriate if the sensor is to be used in an environment with a high introduction of dirt or moisture.

It can also be advantageous in this connection if the transducer receptacle extends through the housing sleeve from the measurement end to the connection end and is located at the connection end with a connection piece in a sealing engagement, so that only one sealing transition is required. The connection piece can then e.g. be part of a connector.

BRIEF DESCRIPTION OF THE DRAWINGS

Further advantages and features of the invention are described hereinafter relative to the attached drawings.

DETAILED DESCRIPTION OF THE INVENTION

Figure 1:
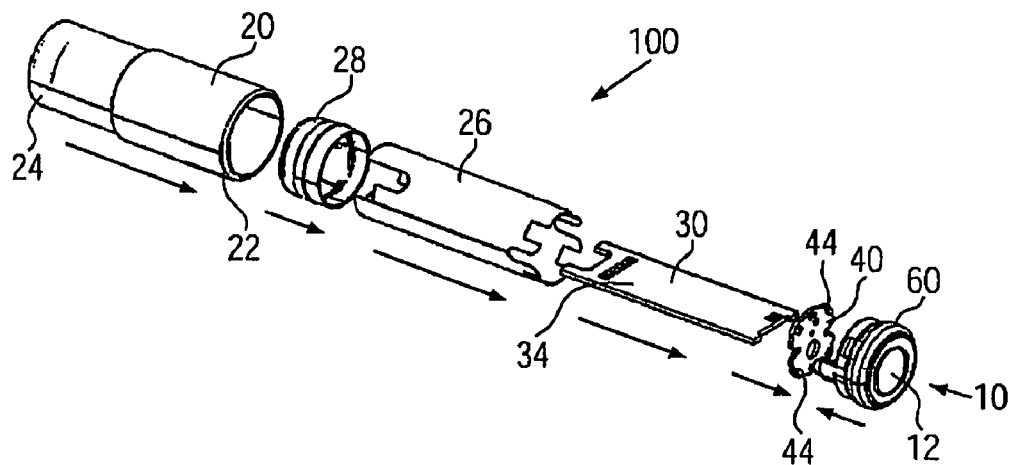
FIG. 1 depicts in an exploded view a first embodiment of an inventive sensor.
Figure 2:
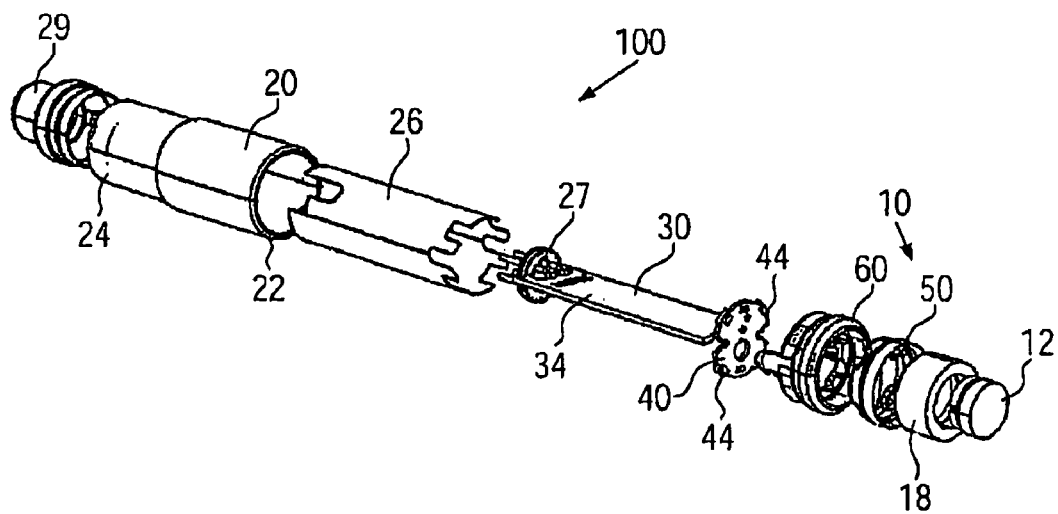
FIG. 2 depicts in an exploded view a second embodiment of an inventive sensor.
Figure 3:
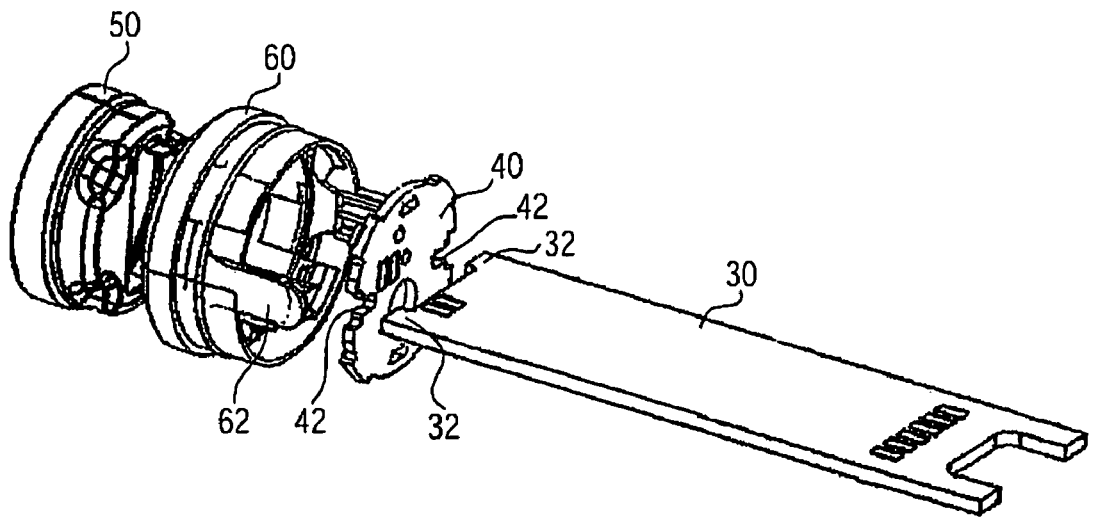
FIGS. 3 to 5 depict further details of the embodiments shown in FIGS. 1 and 2.

FIGS. 1 and 2 show two embodiments of an inventive sensor 100. These are in each case cylindrical ultrasonic sensors, which only constructionally differ in the vicinity of a connection end 24. In the embodiment of FIG. 1 a cable outlet is provided, whereas in that of FIG. 2 there is a plug outlet.

The sensors 100 in each case comprise a transducer unit 10, a housing sleeve 20, a module carrier 30 and a substantially circular disk-shaped illuminant or lighting means carrier 40. The transducer unit 10 incorporates a transducer element 12, in the embodiment shown an ultrasonic transducer, a foaming 18, a shielding can 50 and a transducer receptacle 60.

The module carrier 30, which is in the form of a board, carries sensor electronics 34 (not shown in detail). The illuminant carrier 40 on which are in each case placed four SMD light emitting diodes 44 as illuminants, is also in the form of a board. In the installed state the illuminant carrier 40 is positioned perpendicularly to the module carrier 30 and is at least partly positively received in the transducer receptacle 60.

A shielding sleeve 26 protects the sensor electronics 34 against electromagnetic interference. In the installed state the transducer unit 10 is received in housing sleeve 20 in the vicinity of a measurement end 22. In the assembled state connecting means are provided on the connection end 24 of housing sleeve 20 opposite to the measurement end 22. In the embodiment of FIG. 1 this is in the form of a not shown cable outlet. A connection sleeve 28 is used for the stable positioning of the module carrier 30 in the vicinity of the connection end 24 of housing sleeve 20.

In the variant of FIG. 2 a plug outlet is provided and is essentially formed by a plug module 27 connected to the module carrier 30 and a connection sleeve 29.

Transducer receptacle 60 and connection sleeves 28, 29 are in each case at least partly transparent or semitransparent, so that with the variants of FIGS. 1 and 2 it is possible to have optical signaling of operating and/or switching states of sensor 100 both in the direction of measurement end 22 and in that of connection end 24. The invention more particularly relates to the illuminated transducer unit 10.

Apart from the transparent or semitransparent and illuminated end termination in the vicinity of connection end 24 of sensor 100 is now that an at least semitransparent and illuminatable transducer unit 10 can be used. Through the combination of the two illuminatable sensor terminations in the vicinity of both measurement end 22 and connection end 24, there can be a substantially complete all-round visibility of operating states, switching states and/or other displays important for the proximity switch. The sensors 100 all have a modular construction. Transducer unit 10, module carrier 30 and illuminant carrier 40 are so assembled that the shielding sleeve 26, connection sleeves 28, 29 and housing sleeve 20, which can fundamentally have a random length, can be assembled by simply sliding together during the production process.

Thus, with the sensors shown in FIGS. 1 and 2, light emitting diodes are used for both frontal and terminal switching display purposes. It is particularly advantageous to have illumination in the vicinity of transducer unit 10. It is possible to achieve a reduction of coupling in the case of current supply, i.e. overall an improved current supply behaviour. Simplified installation is possible for the transducer receptacle 60 as a result of a modular concept. The module carrier 30 is guided through the transducer receptacle 60. Reduced construction lengths of the transducer receptacle 60 can be brought about by direct contacting of said transducer receptacle 60.

For optical signaling purposes it is e.g. possible to use yellow, green and red light emitting diodes. For example, a switching display can be signaled with a yellow LED, the presence of a supply voltage with a green LED and a fault or error with a red LED.

In the case of the variant of FIG. 2, the transparent connection sleeve 29, which can also be called an end cap, is firstly completely installed, whereas in the variant of FIG. 1 the housing sleeve 20 is drawn over last. Thus, FIG. 1 involves a one step method. However, in general both assembly types are possible for both variants.

As the sensors generally have a modular construction, the variants of FIGS. 1 and 2 can also be implemented with an angled or bent transducer unit.

The transducer receptacle 60 can be made by moulding round the shielding can 50. Alternatively the shielding can 50 can be merely plugged into the transducer receptacle 60.

The main task for a random transducer unit, particularly in the case of miniaturized sensors, e.g. with a diameter of 18 mm, 12 mm or less, is to render accessible the transducer unit with illuminants, also if the illuminants are SMD light emitting diodes.

Figure 6:
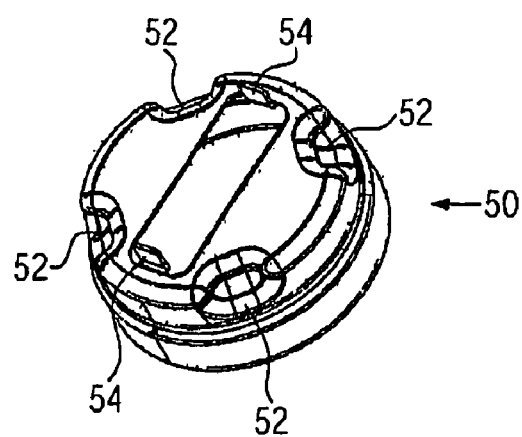
FIG. 6 depicts a shielding can in a perspective view.

As can be gathered from FIG. 6, the shielding can 50 has four symmetrical bulges 52, in which in the installed state engages in each case a light emitting diode. The printed circuit board forming the illuminant carrier 40 is electrically conductively and mechanically connected by means of a soldered joint to the shielding can 50 so as to form the termination of the installation of transducer unit 10. Connection links 54 are formed on the shielding can 50 for soldering the illuminant carrier 40 to said shielding can 50.

The invention can be applied to straight and angled illuminated transducer units, particularly for inductive, capacitive and other electromagnetic sensors.

In the case of inductive sensors, where the transducer element is in the form of a coil close to a front face of the housing sleeve, a difficulty can be encountered in that the coil system takes up virtually the entire front area of the transducer surface. Also in the case of such proximity switches an improved illumination can be achieved with the present invention, e.g. of a circular ring-shaped signal lighting surface.

An improved solution involves a printed circuit board engaging through an extension in the centre of the coil system and brings the illuminants to the transparent transducer receptacle in the front area of the sensor. This is particularly suitable for sensors with transducer receptacles terminated at the housing sleeve end. In the centre of the transparent or semi-transparent transducer receptacle it is also possible to form extensions, e.g. with a moulding compound, which aids light conduction. Additionally or alternatively targeted cavities can be enclosed.

Further details of the inventive sensor and method are explained relative to FIGS. 3 to 8, which in each case apply both to the embodiment of FIG. 1 and the variant of FIG. 2. Equivalent components carry the same reference numerals in all the drawings.

Figure 4:
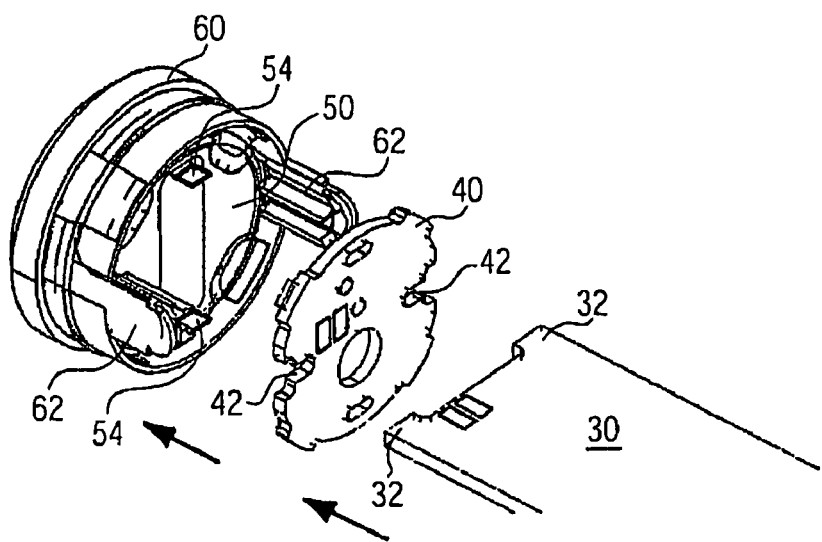

For the easy connection of the module carrier 30 to the transversely positioned illuminant carrier 40, the latter contains milled slots 42, which receive the module carrier 30 with tongues 32. As can be gathered from FIG. 3, the shielding can is inserted from the front in the transducer receptacle 60. The transducer receptacle 60 can also be moulded round the shielding can 50. The illuminant carrier 40, particularly the illuminant carrier 40 already connected to the module carrier 30, is then inserted in the transducer receptacle 50, as is shown in FIGS. 4 and 5.

Figure 5:
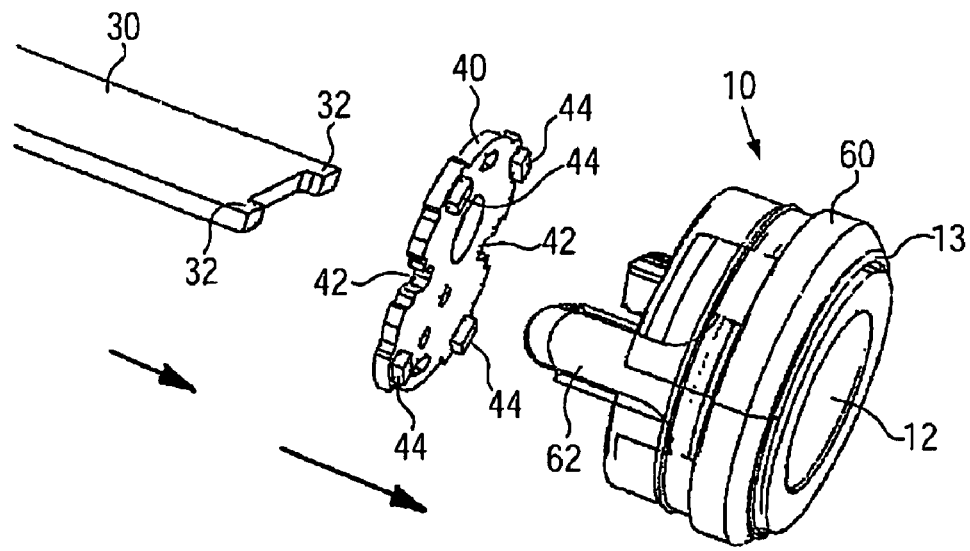

As is particularly clear e.g. in FIG. 5, on the illuminant carrier 40 there are four light emitting diodes 44 as illuminants on an outer circumference of illuminant carrier 40.

Illuminant carrier 40 with light emitting diodes 44 is soldered with the aid of connection links 54 to the shielding can 50 for terminating the installation of transducer unit 10. Following the soldering on of illuminant carrier 40, the module carrier can be simply slid into the guide lugs 62 formed in the transducer receptacle 60 and can be electrically and mechanically connected to illuminant carrier 40. These method steps are particularly apparent from FIGS. 4 and 5 showing the production and partial installation of the module carrier 30. As a result an illuminatable transducer unit 10 can be obtained.

The illuminatable transducer unit 10 is e.g. used for receiving an ultrasonic transducer unit comprising a coupling out layer, a piezoelectric element, a shielding can and a foaming. By means of at least two light coupling in elements 64 the light of light emitting diodes 44 on illuminant carrier 40 is conducted through the transparent or semitransparent transducer receptacle 60 to a front light coupling out ring 13, i.e. to a signal lighting surface, which can only be seen from the outside in an assembled state and as is e.g. shown in FIG. 5.

Figure 7:
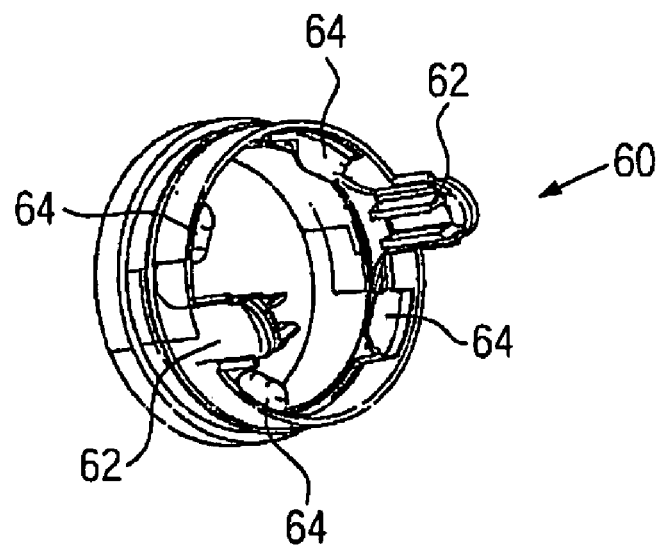
FIGS. 7 and 8 depict a transducer receptacle in perspective views.
Figure 8:
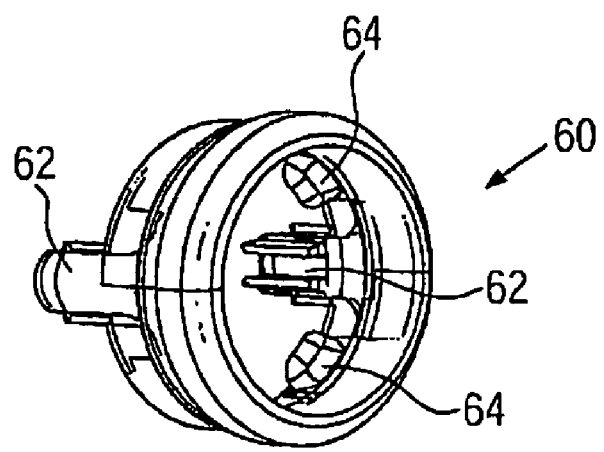

FIG. 5 also shows at the end of transducer receptacle 60 the guide lugs 62 for guiding the module carrier 30 and which are used for centering and fixing the module carrier 30. A light coupling in can optionally also take place by means of the guide lugs 62. For this purpose it is also possible to provide e.g. illuminants at suitable positions on module carrier 30. The light coupling in elements 64 and guide lugs 62 of transducer receptacle 60 are also shown in FIGS. 7 and 8.

FIG. 4 also shows how illuminant carrier 40 is soldered to the links 54 of shielding can 50 in a penultimate production step. After which the complete ultrasonic transducer is foamed in transducer receptacle 60.

FIG. 6 shows shielding can 50 with bulges 52 for the illuminants. A coupling in of electromagnetic interference is largely prevented by means of shielding sleeve 26 and shielding can 50.

Figure 9:
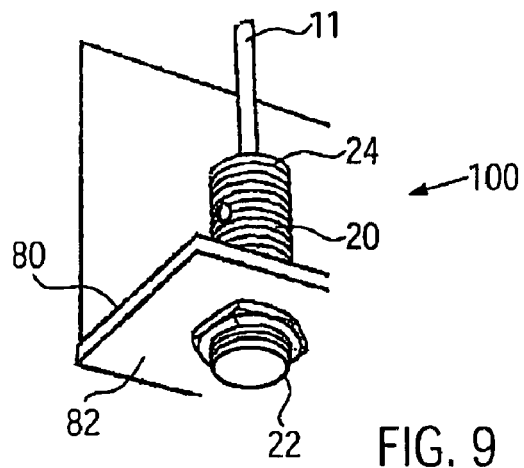
FIGS. 9 to 11 depict installation possibilities for an inventive sensor.
Figure 10:
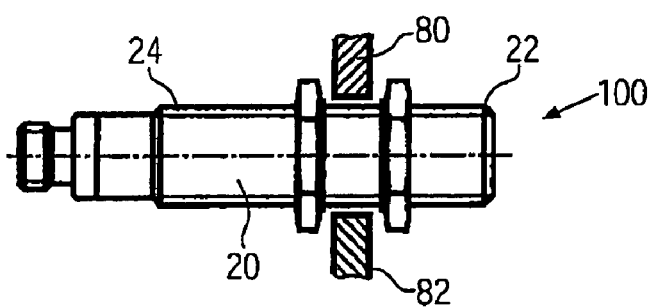
Figure 11:
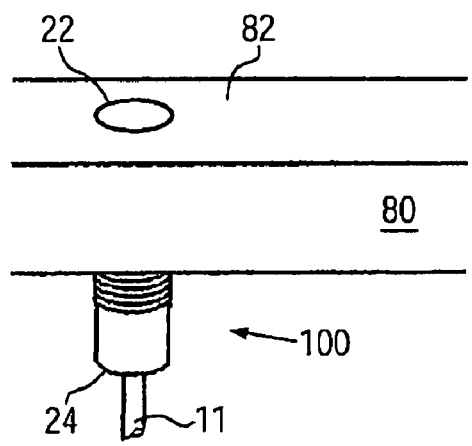

FIGS. 9 to 11 show schematically use possibilities for the inventive sensor 100. FIGS. 9 and 10 show a sealing installation of spacing-measuring sensors, where it is possible to see an inventive sensor 100 installed on a ceiling panel 80. From a viewing or visible side 82 of panel 80 it is possible to examine the illuminatable transducer unit, further details of which are not shown here. Moreover, from a rear sensor side it is possible for a user to see signaling in the vicinity of connection end 24 for a switching state display. A slight limitation to the all-round visibility on the rear side is solely due to a connection cable 11.

FIG. 11 shows an example where an inventive sensor 100 with a measurement end 22 terminates flush with a visible side 82 of panel 80. Here again both at measurement end 22 and connection end 24 optical signaling are implemented, so that overall an excellent all-round visibility is obtained, which is only slightly impaired by connection cable 11 and panel 80.

The present invention provides a novel sensor, particularly for automation engineering, in which with simple means a very extensive all-round visibility of a display of operating states, switching states, programming displays and/or acknowledgement displays can be obtained. The invention can be used with particular advantage in the case of cylindrical proximity switches. The respective transducer can serve as a receiver and/or as a transmitter. It can be a straight transducer, which is placed on a circuit board or can be housed in a cylindrical housing. The transducer can also be housed in a parallelepipedic housing, or use can be made of an angled or bent transducer on a circuit board. As a function of the intended use, these use possibilities can be fundamentally randomly combined. The inventive concept can fundamentally also be used for sensors with parallelepipedic shapes.

An important advantage of the present invention is that there can be a signaling of the desired states and displays both at the measurement end and at a connection end. This significantly facilitates a putting into operation and a monitoring of the satisfactory functioning of an already installed sensor. This is a particularly important advantage, because it makes possible a rapid fault or error diagnosis, e.g. whether a sensor or switch is supplied with an operating voltage, whether certain plausibility tests deliver the correct results, e.g. whether switching outputs are switched and/or whether the sensor is in a programming mode or a normal operating mode.

Thus, the desired signaling can be seen by operating personnel largely independently of the sensor installation position.

The invention claimed is:

1. A sensor, comprising:
a transducer unit placed in a housing sleeve at a measurement end;
a connection system at a connection end of the housing sleeve opposite to the measurement end;
a module carrier received in the housing sleeve and extending along an axis of the housing sleeve;
sensor electronics placed on the module carrier; and
a plurality of illuminants, placed on a separate plate-like illuminant carrier, for optically signaling to the outside at least one of operating and switching states of the sensor;
wherein the illuminant carrier is positioned transversely to the module carrier in a vicinity of the transducer unit.

2. The sensor according to claim 1, further comprising a transducer receptacle which is at least partly made from a transparent plastic.

3. The sensor according to claim 2, wherein the transducer receptacle is partially metallized.

4. The sensor according to claim 1, further comprising:
a transducer receptacle; and
light coupling in elements, wherein the light coupling in elements are shaped onto the transducer receptacle for each illuminant.

5. The sensor according to claim 1, further comprising a transducer receptacle, wherein the illuminant carrier is positively received in the transducer receptacle.

6. The sensor according to claim 1, further comprising a transducer receptacle, wherein in an installed state, the illuminant carrier is supported on an inner wall of at least one of the transducer receptacle and the housing sleeve.

7. The sensor according to claim 1, wherein the illuminant carrier includes recesses for receiving the module carrier.

8. The sensor according to claim 7, wherein the recesses of the illuminant carrier comprise milled slots.

9. The sensor according to claim 1, wherein the connection end includes further illuminants for optically signaling to the outside at least one of operating and switching states of the sensor.

10. The sensor according to claim 9, wherein the illuminants at the connection end are placed on a further illuminant carrier, which is positioned transversely relative to the module carrier.

11. The sensor according to claim 1, wherein the illuminants are light emitting diodes.

12. The sensor according to claim 1, wherein at least one of the illuminants is positioned in an outer marginal area of the illuminant carrier.

13. The sensor according to claim 12, wherein the illuminants are uniformly distributed over a circumference of the illuminant carrier.

14. The sensor according to claim 1, wherein there are at least four illuminants on the illuminant carrier.

15. The sensor according to claim 1, further comprising:
a transducer receptacle, wherein the transducer receptacle is closed at the measurement end.

16. The sensor according to claim 1, further comprising:
a transducer receptacle; and
a connection piece;
wherein the transducer receptacle extends through the housing sleeve from the measurement end to the connection end, and wherein the connection end is in a sealing engagement with the connecting piece.

17. A method for manufacturing a sensor, comprising:
connecting a shielding can to a transducer receptacle;
inserting a transducer element into the shielding can, wherein the shielding can, the transducer receptacle, and the transducer element form a transducer unit;
connecting a plate-like illuminant carrier, on which is located a plurality of illuminants, to the transducer unit;
connecting a module carrier comprising sensor electronics to the transducer unit at a measurement end, wherein the illuminant carrier is positioned transversely relative to the module carrier; and
inserting the module carrier and the connected transducer unit into a housing sleeve, wherein an axis of the housing sleeve runs transversely to the illuminant carrier.

* * * * *